United States Patent [19]

Fedeli et al.

[11] Patent Number: 4,791,605

[45] Date of Patent: Dec. 13, 1988

[54] HYBRID JUNCTION FOR A MAGNETIC BUBBLE MEMORY

[75] Inventors: Jean-Marc Fedeli; Christine Louis, both of Saint Egreve; Joël Magnin, Saint Martin d'Heres; Maryse Vabre, Meylan, all of France

[73] Assignee: Commissariat a l'Energie Atomique, Paris, France

[21] Appl. No.: 8,265

[22] Filed: Jan. 29, 1987

[30] Foreign Application Priority Data

Feb. 5, 1986 [FR] France ............................ 86 01574

[51] Int. Cl.⁴ .......................................... G11C 19/08
[52] U.S. Cl. ..................................... 365/36; 365/43
[58] Field of Search ...................... 365/36, 15, 16, 43

[56] References Cited

FOREIGN PATENT DOCUMENTS 0082526 6/1983 European Pat. Off. .............. 365/36

Primary Examiner—James W. Moffitt

[57] ABSTRACT

A magnetic bubble memory, in which the PI junction between a first propagation track defined by deposited patterns and a second propagation track defined by the boundary between an implanted zone and a non-implanted zone is defined by an overlap between such propagation tracks, wherein the overlap zone has a surface substantially equal to the surface of a magnetic bubble and forms a stable position for each of the two propagation paths.

7 Claims, 3 Drawing Sheets

HYBRID JUNCTION FOR A MAGNETIC BUBBLE MEMORY

The invention relates to a hybrid junction for a magnetic bubble memory and more particularly to the junction enabling a magnetic bubble to be propagated from a zone with deposited patterns to an implanted zone.

Hereinafter such a junction will be referred to for short as a PI or PIJ junction, standing for permalloyimplanted junction.

In a magnetic bubble memory the magnetic bubbles are contained in a monocrystalline magnetic layer, such as a film of magnetic garnet, supported by a non-magnetic monocrystalline garnet. The bubbles take the form of generally cylindrical isolated magnetic areas having a magnetization opposite to that of the remainder of the monocrystalline magnetic layer. The magnetic bubbles are stable by the application of a continuous magnetic field $H_{pol}$ perpendicular to the plane of the magnetic layer. In practice the magnetic field is created by a permanent magnet, which thus ensures the non-volatility of the information contained in the bubble memory.

The bubbles are moved by the application of a continuous rotary field $H_T$ in a direction parallel with the surface of the magnetic layer. The bubbles move around so-called propagation patterns.

Such patterns take the form of discs, lozenges, triangles, Ts, etc. and can be made from an iron and nickel-based material deposited on an insulating layer covering the magnetic layer, or else obtained by implantations in the upper portion of the magnetic layer, through a mask enabling the shape of such patterns to be defined. In the latter case, since ion implantation is performed solely around the motifs, such patterns are referred to as non-implanted patterns The propagation patterns are generally adjacent to one another; because of their shape, two adjacent patterns bound two cavities or valleys between themselves.

The movement of the bubbles along such patterns generally takes place for a duration equal to one third of the period of rotation of the plane magnetic field $H_T$, the bubbles remaining immobile in the cavities defined between two adjacent patterns during the remainder of the cycle. The cavities form so-called stable positions. In this way shift registers are produced in which the binary information "1" is represented by the presence of a bubble and the binary information "0" by the absence of a bubble.

In addition to these propagation patterns, electric conductors must be used to produce in the bubble memory functions of writing, information recording, non-destructive reading, transfer from register to register and erasion.

FIG. 1 shows diagrammatically the known structure of a magnetic bubble memory. It comprises an assembly of loops, known as minor loops, used for the storage of information, which are parallel with one another and disposed along an axis 112 of easy magnetization of the magnetic material. Each minor loop is connected by an exchange gate $4_1, \ldots, 4_n$ to a major writing loop 6 comprising at one end a magnetic bubble generator 8. The major writing loop 6 is aligned along an axis perpendicular to the axis of the minor loops; each exchange gate allows the writing of information in a minor loop.

Each minor loop is also connected by a duplication gate $10_1, \ldots, 10_n$ to a major reading loop 12 parallel with the major writing loop 6. The major reading loop 12 terminates in a detector 14 forming a reading means.

A magnetic bubble memory in hybrid technology comprises two regions 16, 18 comprising deposited patterns, and a region 20 comprising non-implanted patterns. All the elements of the bubble memory are contained solely in the regions 16 and 18, except the minor loops, each of which extends over the three regions. Each minor loop therefore comprises four junctions, IPJ-E, PIJ-E, PIJ-D and IPJ-D, which form junctions between propagation tracks lying in different regions.

The invention relates to junctions enabling a magnetic bubble to pass from a propagation track defined by deposited patterns to a propagation track defined by non-implanted patterns, i.e. the junctions PIJ-E and PIJ-D in FIG. 1.

Such junctions are disclosed more particularly in U.S. Pat. No. 4,453,321 issued June 5, 1984 and assigned to Hitachi, Ltd. FIGS. 2 and 3 illustrate PI-E and PI-D junctions respectively in accordance with the teaching of this citation.

In each figure a first propagation track is defined by a sequence of deposited patterns 22, 24 and 26, a second propagation track being defined by a boundary 28 between an implanted zone 30 and a non-implanted zone 32. The two propagation tracks have generally parallel directions and overlap at the deposited patterns 26.

The junction is defined by the overlap zone 34 between the two propagation tracks. It has a considerable length in face of the diameter of a magnetic bubble, such length being substantially equal to the length of the deposited pattern 26.

The junctions shown in FIGS. 2 and 3 are also characterized by a special shape of the deposited pattern 26, which is curved so as to follow the boundary between the implanted zone and the non-implanted zone, and by a particular direction of the portion 36 of the boundary 28, which is just before the start of the second propagation track. Such portion 36 has a direction perpendicular to the axis of the first and second propagation tracks.

A first variant of the junction illustrated in FIGS. 2 and 3 is disclosed in U.S. Pat. No. 4,525,808, granted on June 25, 1985, in the name of HITACHI. The object of this citation is to modify the direction of the portion 36 of the boundary between the implanted and non-implanted zones, so as to obtain a better phase margin on the field $H_{pol}$ for the passage of a magnetic bubble from the first propagation track to the second propagation track.

Another variant is also described in the Article "Characteristics of junctions between ion-implanted and permalloy tracks in hybrid bubble devices" by N. Kodama et al., published in September, 1984 in IEEE Transactions on Magnetics, Vol.MAG20, No. 5 (PART 1), which suggests the orientation of the portion 36 of the boundary along an axis of easy magnetization of the magnetic material and the use of a deposited pattern 26 of considerable volume.

Another improvement of the PI junction is disclosed in the Article "Design of 2 μm-period minor loops in hybrid bubble memory devices" by M. Ohashi et al., published in September, 1984 in IEEE Transactions on Magnetics, Vol.MAG20, No. 5, wherein a junction is recommended whose direction is perpendicular to the axis of alignment of the propagation tracks.

Clearly, therefore, in the prior art a junction enabling a magnetic bubble to be transferred from a propagation track defined by deposited patterns to a propagation track defined by the boundary between an implanted zone and a non-implanted zone is produced by overlapping between a deposited pattern and said boundary over a considerable length, of the order of magnitude of a deposited pattern. It is also noted that the junction is so oriented in relation to the axes of easy magnetization of the magnetic material that the overlap zone of the two propagation tracks does not form a stable position for a magnetic bubble.

It should be noted that from a technological aspect this overlap of the propagation tracks over a considerable length raises alignment problems between the technological levels, since a slight translational or rotational offsetting between the masks used for the ion implantation and the engraving of the deposited patterns deforms the overlap zone (non constant width, for example), and this may be disastrous for the field margin $H_{pol}$ when the magnetic bubble passes from the first to the second propagation track.

SUMMARY OF THE INVENTION

The invention is aimed more particularly at obviating these problems due to defective alignment of the technological levels.

Another object of the invention is to obtain a considerable field margin $H_{pol}$ for the crossing of a magnetic bubble from the first to the second propagation track.

These objectives are achieved by a junction made in the form of an overlap between a deposited pattern and the implanted zone, whose surface is of the order of magnitude of the surface of a magnetic bubble. For the magnetic bubble to be correctly transferred, in this case the overlap zone must form a stable position for the magnetic bubble. The structure of the junction proposed by the invention is therefore completely different from the structures of the known junctions.

More precisely the invention relates to a hybrid junction of a magnetic bubble memory, comprising a sequence of deposited patterns aligned along an easy magnetization axis of a magnetic material of the memory and forming a first propagation track for magnetic bubbles, and a sequence of non-implanted patterns aligned along the same axis and defining a second propagation track along the boundary between an implanted zone and a non-implanted zone, a junction being made between such propagation tracks to enable a magnetic bubble to pass from the first track to the second track, such junction being defined by an overlap between such propagation tracks, wherein the overlap zone has a surface of the order of magnitude of the size of a magnetic bubble and forms for each of the propagation tracks a stable position for a magnetic bubble.

Preferably the boundary between the implanted zone and the non-implanted zone on each side of the overlap zone are each parallel with an axis of easy magnetization of the magnetic material of the memory.

Advantageously the distance between the overlap zone and the first stable position on the second propagation track is at least equal to half the size of the nonimplanted patterns.

Preferably the last deposited pattern of the first propagation track has a considerable size compared to that of the magnetic bubble and terminates in a point at the overlap zone in its descending portion.

BRIEF DESCRIPTION OF THE DRAWINGS

The features and advantages of the invention will be more clearly gathered from the following illustrative non-limitative description, with reference to the accompanying drawings, wherein.

DESCRIPTION OF THE PREFERRED EMBODIMENTS

Figures 4, 5:
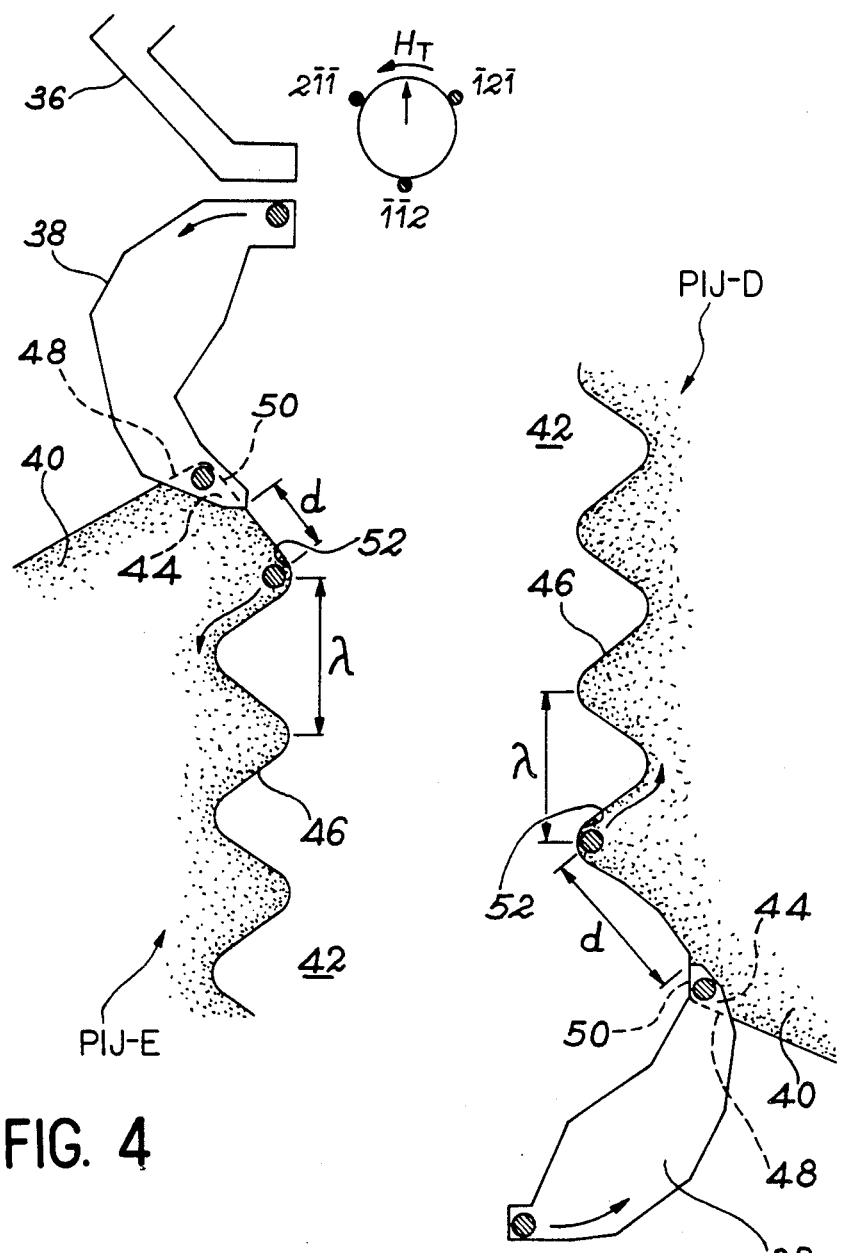
FIG. 4, shows diagrammatically a junction PI-E according to the invention.
FIG. 5 shows diagrammatically a junction PI-D according to the invention.

A PI-E junction according to the invention will first be described with reference to FIG. 4, which shows a deposited pattern 36 and a deposited pattern 38 forming the last element but one and the last element of a series of deposited patterns defining a first propagation track of a magnetic bubble. FIG. 4 also shows an implanted zone 40 whose periphery, forming a boundary 46 between such impanted zone 40 and a non-implanted zone 42, defines a second propagation track for a magnetic bubble. The two propagation tracks have an identical general direction, parallel with an axis $\overline{112}$ of easy magnetization of the magnetic material of the memory.

The junction itself is formed by an overlap 44 between one end of the last deposited pattern 38 and the implanted zone 40. According to the invention the overlap surface is substantially equal to the size of a magnetic bubble, and such overlap position is a stable position for each of the two propagation tracks.

To enable a magnetic bubble to be correctly transferred from the first propagation track to the second propagation track, the bubble must first cross the boundary between the non-implanted zone and the implanted zone. Such crossing is facilitated in known manner by a deposited pattern 38 of considerable volume.

The magnetic bubble must then be strongly attracted to the second propagation track in order to escape from the deposited pattern. This is done in a preferred embodiment of the invention by weakening the deposited pattern 38 in its descending portion by a pointed shape at the overlap zone 44.

As shown in FIG. 4, the stability of the bubble on the second propagation track, in the overlap position, is very efficiently produced by an implanted zone whose edges 48, 50 are parallel with two axes of easy magnetization $\overline{211}$ and $\overline{121}$ of the magnetic material of the memory.

The stability of the first implanted valley 52 following the overlap position on the second propagation track can be weakened by the point of the deposited pattern 38. It some cases, the influence of such point may even lead to the disappearance of the magnetic bubble between the junction 44 and the valley 52. To avoid this, the distance d between the end of the point of the deposited pattern 38 and the first stable position on the second propagation track must be fairly considerable. According to the invention the distance is at least equal to $\lambda/2$, where $\lambda$ is the size of each of non-implanted patterns, defining the second propagation track.

Figure 1:
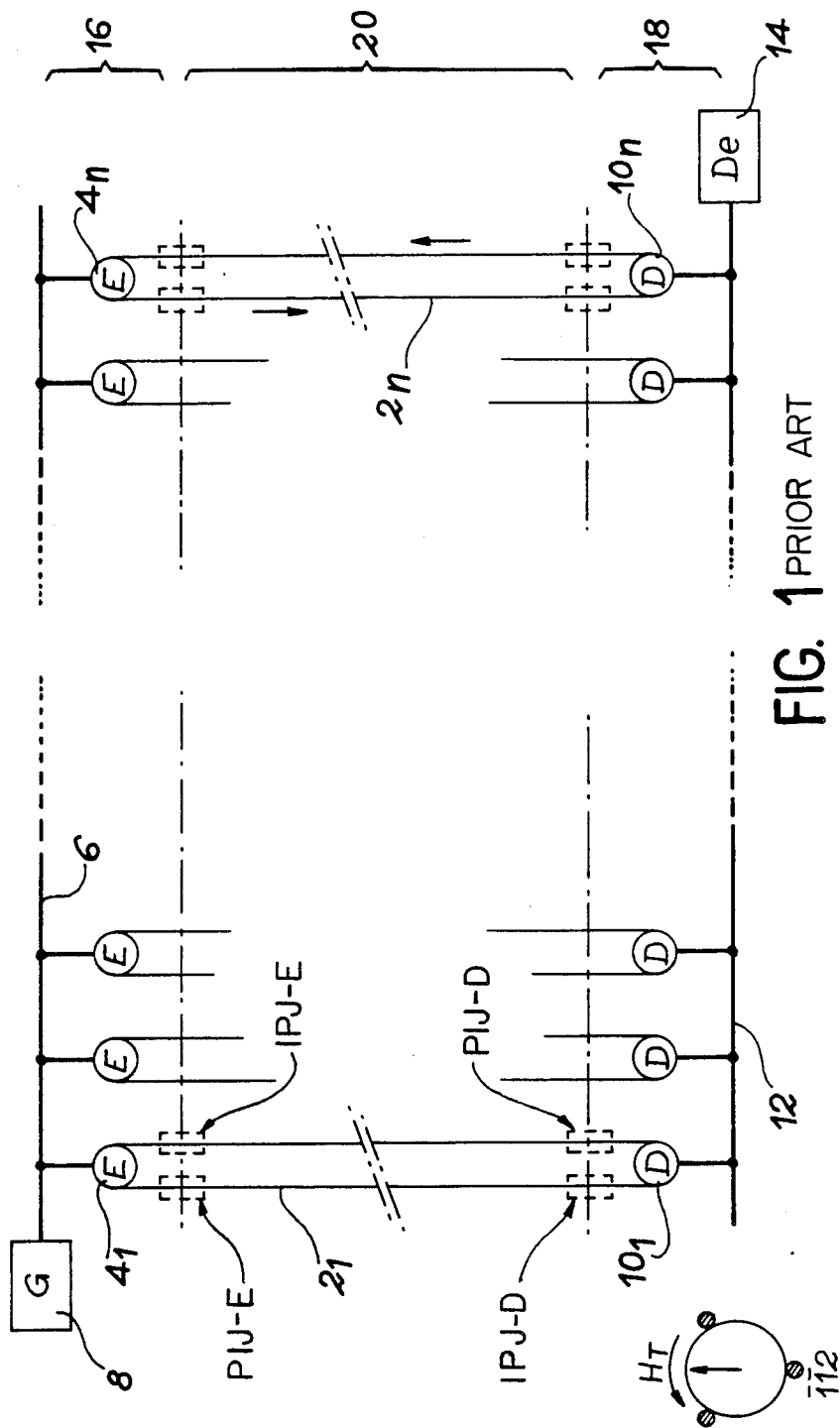
FIG. 1, already described, illustrates diagrammatically the conventional structure of a hybrid junction of a bubble memory, FIG. 2, already described, shows diagrammatically a junction PI-E at an exchange gate according to the prior art, FIG. 3, already described, shows diagrammatically a junction PI-D at a duplication gate according to the prior art.
Figure 2:
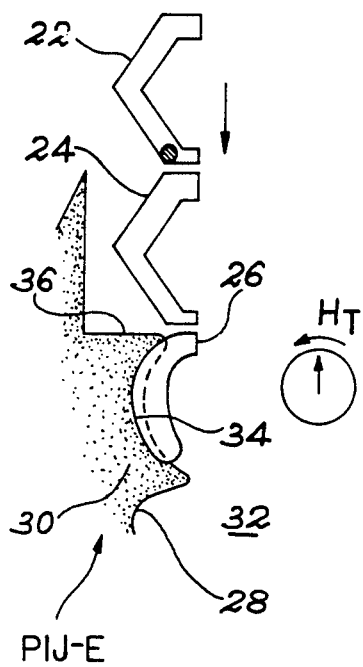
Figure 3:
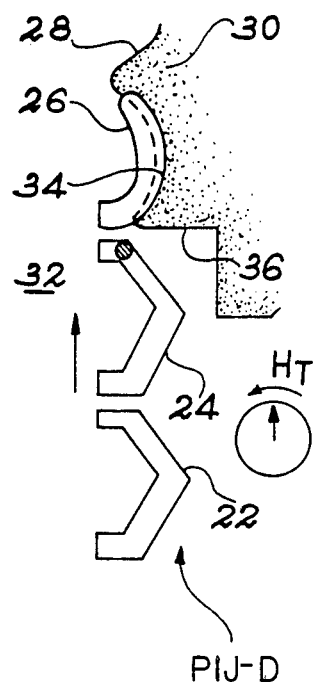

FIG. 4 shows an PI-E junction according to the invention enabling a magnetic bubble to pass from a propagation track defined by deposited patterns to a propagation track defined by the boundary between an implanted zone and a non-implanted zone. The junction lies on a minor loop adjacent an exchange gate E of the magnetic memory (cf. FIG. 1). A junction of the same nature is made on the minor loop adjacent the duplication gate. This junction, denoted by PI-D in FIG. 1, is shown in detail in FIG. 5.

In FIG. 5 like elements to those in FIG. 4 have like references. The first propagation track is defined by deposited patterns, the last deposited pattern 36 but one and the last deposited pattern 38 being shown in the drawing. The second propagation track is defined by the boundary 46 between an implanted zone 40 and a non-implanted zone 42. The two propagation tracks have an identical general direction, mainly parallel with the axis of easy magnetization $\overline{112}$ of the magnetic material of the memory.

According to the invention the overlap between the two propagation tracks is made over a surface 44 substantially equal to the surface of a magnetic bubble, such overlap position being a stable position on each of the two propagation tracks.

As in FIG. 4, the last deposited pattern 38 of the first propagation track has a considerable size compared to that of the bubble, to assist the magnetic bubble to cross the boundary between the non-implanted zone and the implanted zone, such pattern terminating in a point in its descending portion, to weaken the influence of the deposited pattern and thus facilitate the transfer of the magnetic bubble from the overlap position to the second propagation track.

As in the junction shown in FIG. 4, the stability of the second propagation track at the overlap zone 44 is produced by a non-implanted zone whose edges 48,50 are parallel with axes of easy magnetization $\overline{112}$ and $2\overline{11}$ of the magnetic material of the memory.

Lastly, as in the junction illustrated in FIG. 4, the point of the deposited pattern 38 can be adapted to weaken the stability of the first implanted valley 52 on the second propagation track following the overlap zone 44. This problem can be avoided by fixing a distance d between the overlap zone 44 and the first valley 52 on the second propagation track equal to at least $\lambda/2$, where $\lambda$ is the size of each of the non-implanted patterns defining the second propagation track.

The PI type junctions according to the invention, whose particular embodiments have been described with reference to FIGS. 4 and 5, comprise an overlap surface between the two propagation tracks which is of the order of magnitude of a magnetic bubble. This is very advantageous from the technological aspect, since the alignment tolerances between the different technological levels are better than in the prior art junctions, in which the overlap is made over a considerable distance, since if with a correct alignment the overlap zone has a diameter of the order of 1 um (the size of a magnetic bubble), even in the case of poor alignment between the technological levels such overlap zone generally remains between 0.5 and 1.5 um, and this can be tolerated and does not substantially affect the margin of the field $H_{pol}$ for the crossing of the magnetic bubble.

Moreover, the fact that the overlap position coincides with a stable position for each of the two propagation tracks confers a considerable field phase margin $H_{pol}$ on the PI-type junctions according to the invention.

Figure 6:
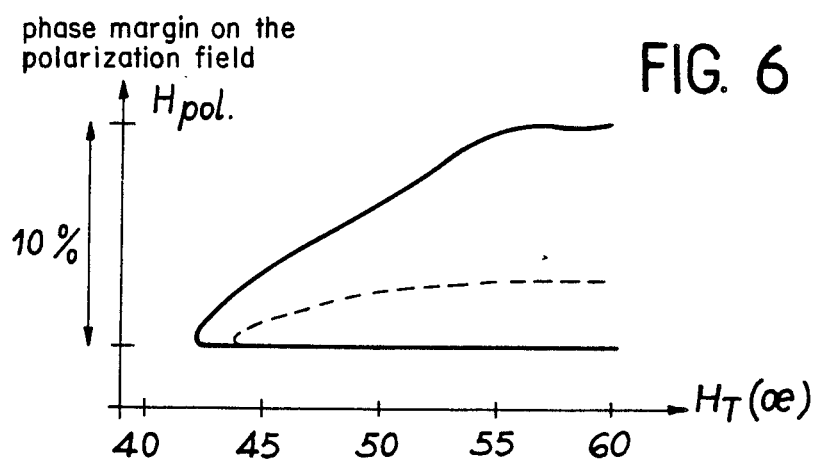
FIG. 6 is a graph showing the phase margin on the polarization field $H_{pol}$ for the transfer of a magnetic bubble from the first propagation track to the second propagation track for a known junction and for a junction according to the invention.

The graph in FIG. 6 illustrates such phase margin for a joint according to the invention (solid line) and for a conventional junction (chain line). It can be seen that the field margin $H_{pol}$ does not exceed 3% for a conventional junction, whatever the intensity of the rotary field $H_T$ may be, while the phase margin is of the order of 5% for a field of 50 oersteds for a junction according to the invention, and reaches about 10% for the field higher than 55 oersteds.

We claim:

1. A hybrid magnetic bubble memory having a sequence of deposited patterns aligned along an easy magnetization axis of a magnetic material of the memory and forming a first propagation track for magnetic bubbles, and a sequence of non-implanted patterns aligned along the same axis and defining a second propagation track along a boundary between an implanted zone and a non-implanted zone, A junction extending between said first and second propagation tracks to enable a magnetic bubble to pass from the first track to the second track and being defined by an overlap zone between said propagation tracks, said overlap zone having a surface of the order of magnitude of the size of a magnetic bubble and forming for each of the propagation tracks a stable position for the magnetic bubble.

2. A memory according to claim 1, wherein at the overlap zone the second propagation track has an implanted valley defined by edges which are each parallel with an easy magnetization axis of the magnetic material of the memory.

3. A memory according to claim 1, wherein the distance between the overlap zone and a first stable position on the second propagation track following said overlap zone is at least equal to half the size of each of the non-implanted patterns of the second propagation track.

4. A memory according to claim 1, wherein the last deposited pattern of the first propagation track has a size considerably larger than the size of the bubble and terminates in a point at the overlap zone.

5. A memory according to claim 2, wherein the distance between the overlap zone and a first stable position on the second propagation track following said overlap zone is at least equal to half the size of each of the non-implanted patterns of the second propagation track.

6. A memory according to claim 2, wherein the last deposited pattern of the first propagation track has a size considerably larger than that of the bubble and terminates in a point at the overlap zone.

7. A memory according to claim 5, wherein the last deposited pattern of the first propagation track has a size considerably larger than that of the bubble and terminates in a point at the overlap zone.

* * * * *